US010818481B2

(12) United States Patent
Sun et al.

(10) Patent No.: US 10,818,481 B2
(45) Date of Patent: Oct. 27, 2020

(54) SMART DEVICE FABRICATION VIA PRECISION PATTERNING

(71) Applicant: APPLIED MATERIALS, INC., Santa Clara, CA (US)

(72) Inventors: Jennifer Sun, Mountain View, CA (US); Yikai Chen, Santa Clara, CA (US); Biraja Kanungo, San Jose, CA (US); Vahid Firouzdor, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/215,382

(22) Filed: Jul. 20, 2016

(65) Prior Publication Data

US 2016/0329195 A1 Nov. 10, 2016

Related U.S. Application Data

(62) Division of application No. 14/077,043, filed on Nov. 11, 2013, now Pat. No. 9,420,639.

(51) Int. Cl.
*H01J 37/32* (2006.01)
*H05B 3/26* (2006.01)
(Continued)

(52) U.S. Cl.
CPC ......... *H01J 37/32935* (2013.01); *C23C 4/01* (2016.01); *C23C 4/134* (2016.01); *H01J 37/32495* (2013.01); *H01J 37/32522* (2013.01); *H01J 37/32724* (2013.01); *H01L 21/67069* (2013.01); *H05B 1/0233* (2013.01); *H05B 3/265* (2013.01); *H01J 2237/244* (2013.01);
(Continued)

(58) Field of Classification Search
None
See application file for complete search history.

(56) References Cited

U.S. PATENT DOCUMENTS 6,190,040 B1 2/2001 Renken et al.
8,596,137 B2 * 12/2013 Mathias .................. G01B 5/20
702/155

(Continued)

OTHER PUBLICATIONS

International Preliminary Report on Patentability from PCT/US2014/063753 dated May 26, 2016, 8 pgs.
(Continued)

*Primary Examiner* — Khaja Ahmad
(74) *Attorney, Agent, or Firm* — Schwabe, Williamson & Wyatt, P.C.

(57) ABSTRACT

Embodiments involve smart device fabrication for semiconductor processing tools via precision patterning. In one embodiment, a method of manufacturing a semiconductor processing tool component includes providing a substrate of the semiconductor processing tool component, patterning the substrate to form a sensor directly on the substrate, and depositing a top layer over the sensor. The sensor may include, for example, a temperature or strain sensor. The method can also include patterning the substrate to form one or more of: heaters, thermistors, and electrodes on the substrate. In one embodiment, the method involves patterning a surface of the component oriented towards a plasma region inside of the semiconductor processing tool.

12 Claims, 5 Drawing Sheets

(51) Int. Cl.
*C23C 4/01* (2016.01)
*C23C 4/134* (2016.01)
*H05B 1/02* (2006.01)
*H01L 21/67* (2006.01)

(52) U.S. Cl.
CPC ... *H01J 2237/332* (2013.01); *H01J 2237/334* (2013.01); *H05B 2203/013* (2013.01)

(56) References Cited

U.S. PATENT DOCUMENTS

| | | | | |
|---|---|---|---|---|
| 2005/0071039 A1* | 3/2005 | Mitrovic | ............. | G06F 17/5018 700/121 |
| 2005/0171703 A1* | 8/2005 | Goldfine | ............ | G01N 27/9013 702/30 |
| 2005/0229849 A1* | 10/2005 | Silvetti | ............... | C23C 16/4404 118/715 |
| 2005/0241579 A1* | 11/2005 | Kidd | ................... | H01J 37/3244 118/715 |
| 2005/0284570 A1* | 12/2005 | Doran | ................. | H01J 37/32935 156/345.24 |
| 2006/0108332 A1 | 5/2006 | Belashchenko | | |
| 2007/0259130 A1* | 11/2007 | Von Kaenel | ...... | C23C 16/45565 427/569 |
| 2008/0178608 A1* | 7/2008 | Tandou | ................... | F25B 39/02 62/6 |
| 2008/0261800 A1* | 10/2008 | Yuan | ...................... | C03B 32/00 501/152 |
| 2008/0273572 A1* | 11/2008 | Lawrence | ........... | G01N 25/482 374/45 |
| 2009/0056441 A1 | 3/2009 | Sun et al. | | |
| 2009/0150029 A1* | 6/2009 | Pavelescu | .............. | G01P 15/08 701/45 |
| 2011/0092072 A1 | 4/2011 | Singh et al. | | |
| 2011/0174777 A1 | 7/2011 | Jensen et al. | | |
| 2011/0176763 A1 | 7/2011 | Wong | | |
| 2011/0308453 A1* | 12/2011 | Su | ......................... | C23C 16/303 118/708 |
| 2012/0248506 A1* | 10/2012 | Yang | ...................... | H01L 22/12 257/254 |

OTHER PUBLICATIONS

International Search Report and Written Opinion of the International Searching Authority dated Jan. 28, 2015, in International Patent Application No. PCT/US2014/063753 11 pgs.
Non-Final Office Action from U.S. Appl. No. 15/215,382 dated Dec. 1, 2015, 13 pgs.
Office Action from U.S. Appl. No. 15/215,382 dated Jul. 7, 2015, 13 pgs.

* cited by examiner

SMART DEVICE FABRICATION VIA PRECISION PATTERNING

CROSS-REFERENCE TO RELATED APPLICATIONS

This application is a divisional of U.S. patent application Ser. No. 14/077,043, filed on Nov. 11, 2013, the entire contents of which are hereby incorporated by reference herein.

BACKGROUND

1) Field

Embodiments of the present invention pertain to the field of semiconductor processing, and in particular, to smart device fabrication for semiconductor processing tools via precision patterning.

2) Description of Related Art

In semiconductor processing, such as plasma etching or deposition, the temperature of the processing tool components can affect the rate of processing. For example, chamber lid temperature variation can create a large gradient in the wafer etch rate and critical dimensions. Non-uniform temperature distributions of processing tool components can result in particle defects and metal contamination on the semiconductor wafer, as well as affect processing (e.g., critical dimension) uniformity.

However, typical processing tool components are either passive in the sense that they lack temperature feedback mechanisms, or have temperature feedback mechanisms that lack accuracy. The lack of accurate temperature feedback in processing tool components can result in non-uniform temperature distributions in the components, leading to high defect rates on the processed semiconductor wafers, and a shortened useful life of the components due to thermal stress induced cracking of bulk as well as coated components.

SUMMARY

One or more embodiments of the invention involve smart device fabrication for semiconductor processing tools via precision patterning.

In one embodiment, a method of manufacturing a semiconductor processing tool component involves providing a substrate of the semiconductor processing tool component. The method involves patterning the substrate to form a sensor directly on the substrate. The method further involves depositing a top layer over the sensor.

In one embodiment, a semiconductor processing tool component includes a substrate, and a sensor disposed directly on a surface of the substrate oriented towards a plasma region inside of the semiconductor processing tool. A top layer is disposed over the sensor.

In one embodiment, a semiconductor processing system includes a semiconductor processing chamber. The semiconductor processing chamber has a component including a substrate, and a sensor disposed directly on a surface of the substrate oriented towards a plasma region inside of the semiconductor processing tool. A top layer is disposed over the sensor. The component further includes a heating element disposed directly on the surface of the substrate oriented towards the plasma region inside of the semiconductor processing tool. The semiconductor processing, system also includes a controller to control a temperature of the component with the heating element based on temperature measurements from the sensor.

BRIEF DESCRIPTION OF THE DRAWINGS

Embodiments of the present invention are illustrated bye way of example and not by way of limitation, and can be more fully understood with reference to the following detailed description when considered in connection with the figures in which.

DETAILED DESCRIPTION

Embodiments include apparatuses, systems, and methods of smart device fabrication for semiconductor processing tools via precision patterning.

According to embodiments, smart processing tool components include devices patterned directly on the component substrate to enable feedback and control of parameters such as temperature and strain. In one embodiment, a method of manufacturing the smart processing tool components involves precision patterning of one or more devices directly on a substrate of the component. The method further includes forming as top layer over the devices.

The processing tool components can include devices patterned on any surface of the component, including surfaces oriented towards a plasma region of the processing, tool. Processing tool components can include any component of a processing tool such as, for example, a plasma chamber lid, a showerhead, a processing chamber liner, an electrostatic chuck, a gas distribution plate, a nozzle, and a process kit ring, and/or other processing tool components. The devices patterned directly on the components can include, for example, one or more of a sensor, electrode, heater, and thermistor.

Embodiments involving precision patterning can enable fine feature deposition to form devices without requiring masking and other sacrificial layers, resulting in less wasted material. Therefore, embodiments may have the additional benefit of being efficient and cost-effective (due to, e.g., reduced material waste involved in forming the devices). Additionally, embodiments can enable forming sensors and other devices directly on component substrates to provide feedback and control heating or cooling at specific locations on the component. Therefore, embodiments enable precise and/or uniform temperature control of the processing tool component, improved temperature uniformity can enable a lower defect rate of semiconductor wafers processed with the tool. Improved temperature uniformity can also reduce damage to the semiconductor processing tool components. Precise monitoring of parameters such as temperature or strain can further enable prediction of the lifetime of the components. Predicting when a component is likely to fail can enable replacement or repair of the component prior to failure, which can prevent wafer defects resulting from component failure.

Figure 1:
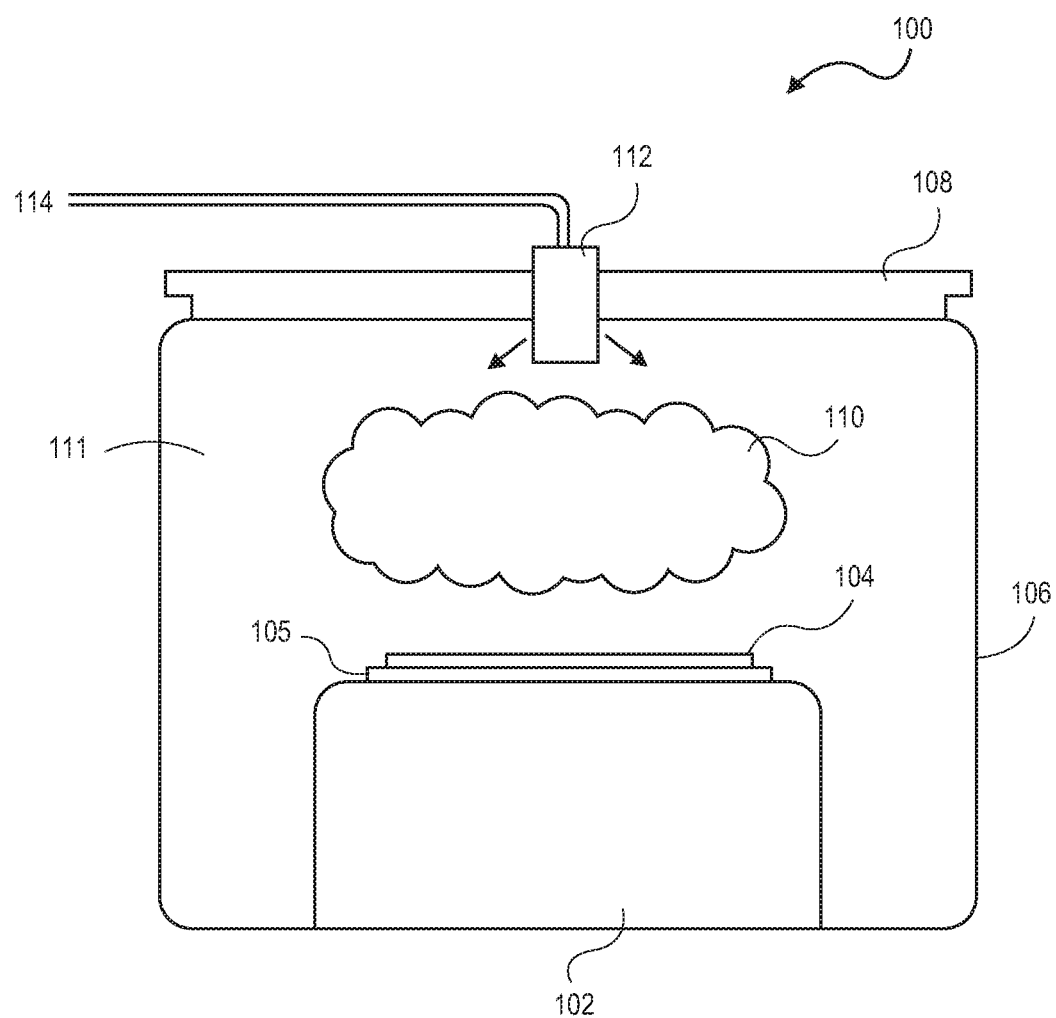
FIG. 1 illustrates an exemplary semiconductor processing tool, which includes components with devices patterned directly on the component substrate, in accordance with embodiments of the present invention.

FIG. 1 illustrates an exemplary semiconductor processing tool (e.g., a processing chamber), which may include components in accordance with embodiments of the present invention. The system 100 is an example of a plasma chamber. The system 100 includes chamber walls 106, and a chamber lid 108. The system 100 includes a showerhead 112 or other mechanism for introducing process gases 114 or other precursors into the chamber. A sample holder 102 supports a semiconductor wafer 104 over an electrostatic chuck (ESC) 105. The sample holder 102 may include an electrode (e.g., cathode) to bias the sample holder 102.

The semiconductor wafer 104 is located between the sample holder 102 and a plasma region 111 that contains plasma 110 during plasma processing with the system 100. According to embodiments, components of the system 100 may be manufactured by a process that includes patterning a substrate of the component(s) to form a device directly on the component(s), as is illustrated in the method 200 of FIG. 2. For example, one or more components of the system 100, such as the showerhead 112, the chamber lid 108, or the ESC 105, may include temperature sensors patterned on the substrate of the component.

The system 100 includes a controller not shop to control and operate the system 100. A controller may include a processor, memory, and other components as described below with respect to the computer system 500 of FIG. 5. According to one embodiment, the controller can control a temperature of the component based on temperature measurements from sensors patterned on the component substrate. Although FIG. 1 illustrates a plasma processing chamber, embodiments can include components for other semiconductor processing tools.

Figure 2:
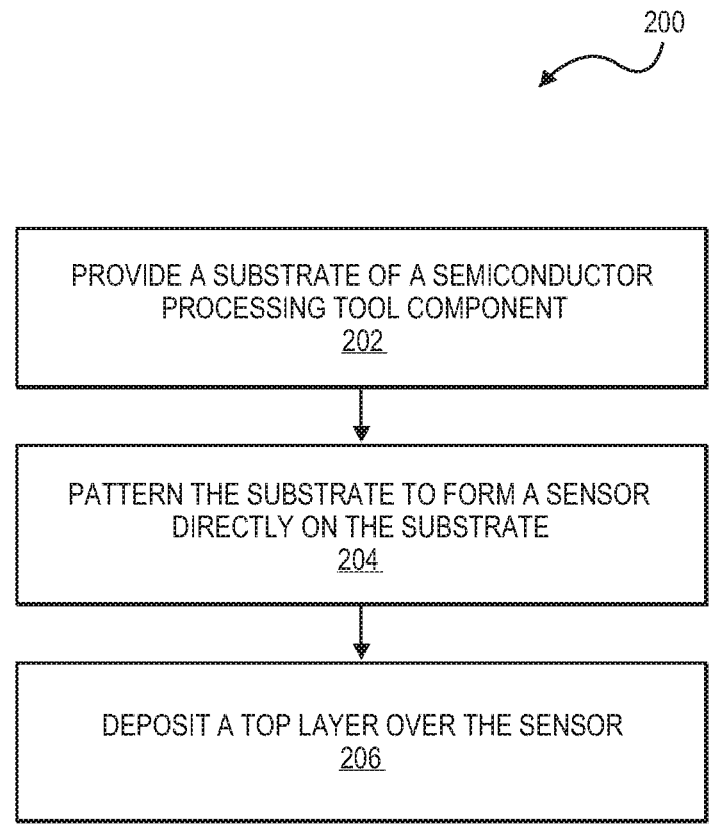
FIG. 2 is a flow diagram of a method of manufacturing a semiconductor processing tool component, in accordance with an embodiment of the present invention.

FIG. 2 is a flow diagram of a method of manufacturing a semiconductor to processing tool component, in accordance with an embodiment of the present invention. The method 200 begins with providing a substrate of a semiconductor processing tool component at operation 202. For example, a precision patterning system can provide a substrate for the showerhead 112, the chamber lid 108, or the electrostatic chuck 105 of the system 100 of FIG. 1. The method may also (or alternatively) involve providing a substrate for processing tool components not illustrated in FIG. 1, for example, a processing chamber liner, a gas distribution plate, a nozzle, a process kit ring, or any other processing tool component. According to embodiments, the substrate of the component may include a bulk metal, a bulk metal oxide, a bulk metal nitride, or bulk metal carbide, where the term "bulk" refers to a single material. Examples of a bulk metal include Al, Ti, Cu, and Ni. Examples of a bulk metal oxide include $Al_2O_3$, $Y_2O_3$, or a mix of metal oxides. An example of a bulk metal nitride is AlN. An example of a bulk metal carbide is SiC. In other embodiments, the substrate may include more than one material.

At operation 204, the precision patterning system patterns the substrate to form one or more sensors directly on the substrate. Sensors may include, for example, temperature sensors (e.g., thermocouples), strain sensors, and/or other types of sensors. Although examples herein refer to patterning the component substrate to form sensors, embodiments may also (or alternatively) involve patterning the substrate to form one or more other devices, such as heaters, electrodes, and/or thermistors. Patterning the substrate to form devices may involve printing two-dimensional (2D) or three-dimensional (3D) patterns.

According to embodiments, patterning the semiconductor wafer or substrate to form devices involves patterning the substrate with a metal and/or a ceramic. For example, the precision patterning system can deposit one or more of NiCr, NiAl, NiSil, NiCrSil, CuNi, NiCrAlY, FeNi, PdAg, indium tin oxide (ITO), yttria-stabilized zirconia (YSZ), $MgAl_2O_4$, Cu, Ni, Pt, Pd, Au, Al, Mo, W, $Al_2O_3$, $MoSi_2$, $Si_3N_4$, BeO, AlN, oxides of manganese, nickel, cobalt, iron, copper and titanium, a doped polycrystalline ceramic containing barium titanate (BaTiO3), and/or other metals and ceramics.

In one embodiment, using precision patterning directly on a component substrate enables the formation of devices with small dimensions. For example, in one embodiment, a precision patterning stem can form a sensor having a thickness in the range of 0.005 mm to 0.5 mm, and a width in the range of 0.05 mm to 2 mm. In one embodiment with a heater patterned directly on the component substrate, the heater has a thickness in the range of 0005 mm to 1 mm, and a width in the range of 1 mm to 25 mm. In one embodiment with an electrode patterned directly on the component substrate, the electrode has a thickness in the range of 0.005 mm to 1 mm, and a width in the range of 0.05 mm to 2 mm. In one embodiment with a thermistor patterned directly on the component substrate, the thermistor has a thickness in the range of 0.005 mm to 0.5 mm, and a width in the range of 0.05 mm to 2 mm.

Any precision patterning system capable of forming the devices on the processing component substrate may be used. A precision patterning system is a system that can form 2D or 3D structures (e.g., according to a model) by locally patterning a substrate (e.g., precision plasma spray deposition). Patterning can include, for example, deposition of materials, etching (removal) of materials, and/or surface chemical modification (e.g., surface functionalization such as hydrogenation, hydroxylation, chlorination, fluorination, silylation, and other surface property modification). In one embodiment involving patterning the component substrate to form 3D structures, the system can build the 3D structure layer-by-layer. In one embodiment, the substrate itself can have a 3D geometry over which the pattern can be deposited. For example, the substrate of a process kit ring may have a curved surface upon which the sensor can be directly formed. Other components may have other 3D geometries or 2D geometries.

In one embodiment, patterning the substrate involves a precision plasma spray. An example of a precision plasma spray system is described below with respect to FIG. 4. Other precision patterning systems may be used, for example, systems using piezoelectric printheads or other printheads, or point plasma sources (e.g., plasma sources with small apertures capable of precisely directing plasma streams). The precision patterning system may include mechanisms for moving the source (e.g., plasma source, printhead, etc.) and a sample holder relative to each other to pattern the component substrate according to a model. Patterning can also include selective removal of materials that is being deposited through one of the above depositing techniques. Selective removal can be done by laser cutting, wet etching, dry etching, or by any other method of selective removal.

At operation 206, the precision patterning system deposits a top layer over the sensor. In embodiments, depositing the top layer can include depositing one or more of $Y_2O_3$, yttria-stabilized zirconia (YSZ), YAG, $ZrO_2$, $Al_2O_3$, $Er_2O_3$, or $Gd_2O_3$, a mixture of $Y_2O_3$ and $ZrO_2$ (e.g., with a ratio of 83:17 mol %), a mixture of $Y_2O_3$, $ZrO_2$, $Er_2O_3$, $Gd_2O_3$, and $SiO_2$ (e.g., with a ratio of 40:5:40:7:8 mol %), or any rare earth oxide or a mixture of rare-earth oxides such as $Er_2O_3$ or $Gd_2O_3$. In one embodiment, the top layer has a thickness in the range of 0.005 mm to 1 mm. Deposition of the top layer over the sensor may be performed by the same precision patterning system that patterns the substrate to form the sensors or other devices, or by a different system. Other systems may include traditional air plasma spray, vacuum plasma spray, low pressure plasma spray, a spin-coating machine, a chemical vapor deposition (CVD) chamber, an atomic layer deposition (ALD) chamber, ion-assisted deposition, or any other appropriate deposition system.

In an embodiment where the sensor (or other device) is formed on a plasma-facing surface of the component, depositing the top layer over the sensor involves depositing a plasma-resistant layer. One such embodiment can enable forming sensors near the plasma region of a semi-conducting tool, and therefore enable more accurate measurements than, existing processing tool sensors in one embodiment, depositing the top layer over the sensor involves depositing a dielectric layer.

Thus, the method 200 of FIG. 2 enables patterning of semiconductor processing components to form devices directly on the component substrate. Embodiments enable formation of multiple devices across a surface of the component. For example, embodiments enable temperature sensors formed at different points on the component surface, which can enable accurate local temperature measurements. Furthermore, embodiments enable formation of sensors and other devices on surfaces facing a plasma region of a processing tool, which permits measuring the temperature in areas that may have the greatest impact on the process. Thus, unlike existing methods for estimating the temperature within the processing tool, which may include sensors that are external from the processing tool, or located away from the harsh processing environment to prevent destruction or damage to the sensors, embodiments enable temperature feedback on surfaces within the processing tool. Improved temperature and strain measurements can enable improved temperature control and uniformity over existing processing tools.

For example, in one embodiment that forms temperature sensors on an ESC, in-situ temperature measurements from the sensors can enable active heating or cooling to achieve a uniform temperature on the ESC. A uniform temperature on the ESC can result in improved etch rate uniformity across the semiconductor wafer supported over the ESC.

Similarly, in one embodiment that forms heater and a temperature sensor on a processing chamber lid, a controller can automatically adjust the temperature of the lid in areas experiencing the greatest temperature changes to keep the temperature difference below a threshold value (e.g., $\Delta T<30$ C). Limiting the temperature difference on the lid can reduce lid breakage due to thermal stress induced cracking caused by a center-to-edge temperature difference.

In another example, embodiments can enable prediction of remaining coating thickness on a component, which, in some embodiments, enables prediction of remaining component lifetime. For example, a processing chamber liner (e.g., a ceramic coating over an Al substrate) can include strain sensors to provide strain feedback. The controller can monitor the strain near a surface of the liner over time to predict the rate of erosion of the coating on the liner.

In another example, a showerhead includes sensors to provide temperature or strain measurements. Heaters or coolers (e.g., heaters on the showerhead base) can control the temperature to reduce temperature differences across the showerhead center-to-edge temperature differences). Reducing temperature differences on the showerhead can result in a more uniform etch rate.

In yet another example, a process kit ring can include sensors. A process kit ring surrounds the semiconductor wafer and is typically the closest component to the semiconductor wafer. Therefore, slight thermal stress related degradation in the process kit ring can significantly affect defect rates on the semiconductor wafer. Additionally, process kit rings can be coated with an erosion resistant coating to address high erosion rates typically experienced by process kit rings. Embodiments with sensors patterned on the process kit ring substrate can provide temperature measurements for the process kit ring, enabling heaters or coolers to adjust the temperature of the process kit ring to increase temperature uniformity. Similar to the liner described above, embodiments may also involve predicting, the lifetime of the process kit ring (e.g., based on remaining coating thickness and/or bulk thickness change).

Figure 3A:
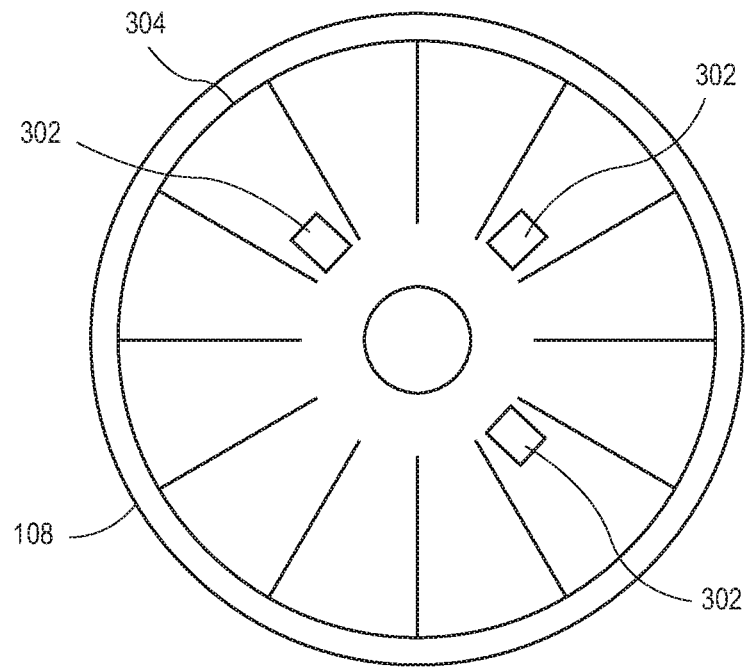
FIG. 3A is a plan view of a semiconductor processing chamber lid with devices patterned directly on the chamber lid substrate, in accordance with embodiments of the present invention.
Figure 3B:
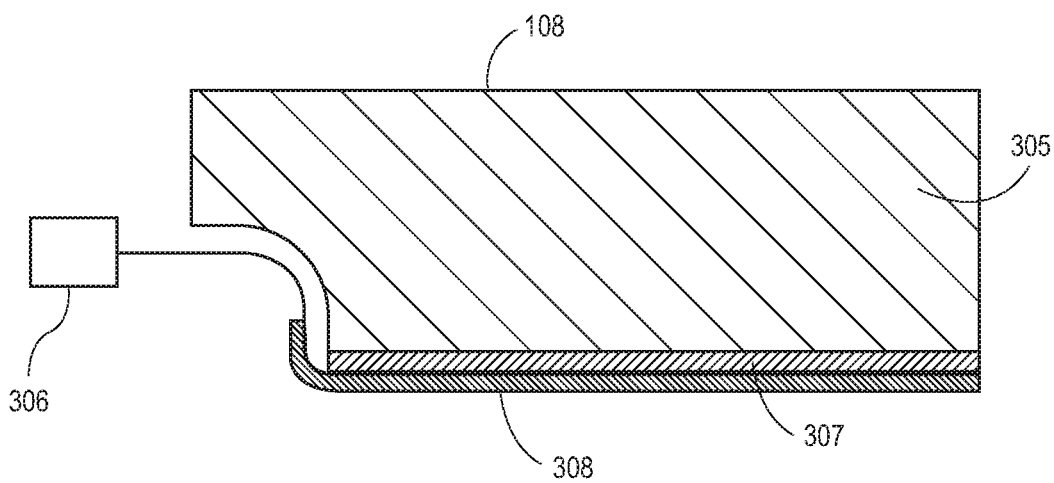
FIG. 3B is cross-sectional view of the semiconductor processing chamber lid of FIG. 3A, in accordance with embodiments of the present invention.

Thus, the method 200 of FIG. 2 can be used to manufacture a variety of semiconductor processing tool components with sensors and/or other devices formed directly on the component substrate. FIGS. 3A and 3B illustrate an example of one such component.

FIG. 3A is a plan view of a semiconductor processing chamber lid 108 with devices 302 and 304, in accordance with embodiments of the present invention. FIG. 3B is a cross-sectional view of the semiconductor processing chamber lid 108 illustrated in FIG. 3A, in accordance with embodiments of the present invention.

Turning to FIG. 3A, the processing chamber lid 108 includes thermocouples 302 located at different locations on the processing chamber lid 108. Thus, a semiconductor processing system including the processing chamber lid 108 can measure the temperature at multiple locations on the processing chamber lid 108. FIG. 3A illustrates three thermocouples, but other embodiments may include one, two, or more than three thermocouples or other sensors. In one embodiment, sensors are arranged on the processing chamber lid 108 to detect temperature differences between regions of the processing chamber lid 108, such as temperature differences between the center and edge of the processing chamber lid 108. In contrast to existing mechanisms for determining temperatures inside of a semiconductor processing tool, embodiments enable precise temperature measurements of components in the tool.

The processing chamber lid 108 can also (or alternatively) include other devices as discussed above. For example, the processing chamber lid 108 can include heaters such as the heating circuit 304. The heating circuit 304 can include heating elements arranged in zones to enable individual control of the temperature in different zones of the processing chamber lid 108.

FIG. 3B illustrates a cross-sectional view of the processing chamber lid 108. As illustrated in FIG. 3B, the processing chamber lid 108 includes a substrate 305. As described above with respect to operation 202 of the method 200, in embodiments, the substrate is a bulk, metal or ceramic substrate. One or more devices 307 are disposed directly on the surface of the substrate 305. In the illustrated example, the one or more devices 307 include the heating circuit 304, the thermocouples 302, and/or other devices. A top layer 308 is disposed over the devices 307.

In one embodiment, the devices 307 are disposed directly on a surface of the substrate 305 oriented towards a plasma region inside of the semiconductor processing tool. In one such embodiment, the top layer 308 is a plasma-resistant layer.

In one embodiment, the processing chamber lid 108 includes, or is coupled to, a circuit 306. The circuit 306 can include, or couple to, a controller for receiving measurements from sensors, and controlling the devices (e.g., the heating circuit 304). In one such embodiment, the system can control the heating circuit 304 to heat areas of the chamber lid 108 based on temperature measurements from the thermocouples 302. Thus, embodiments including multiple sensors and heaters at different locations on the component enable the system can achieve precise temperature control and/or a uniform temperature of the component.

Although the exemplary embodiments illustrated in FIGS. 3A and 3B involve a processing chamber lid, the examples described above can also apply to other semiconductor processing tool components.

Figure 4:
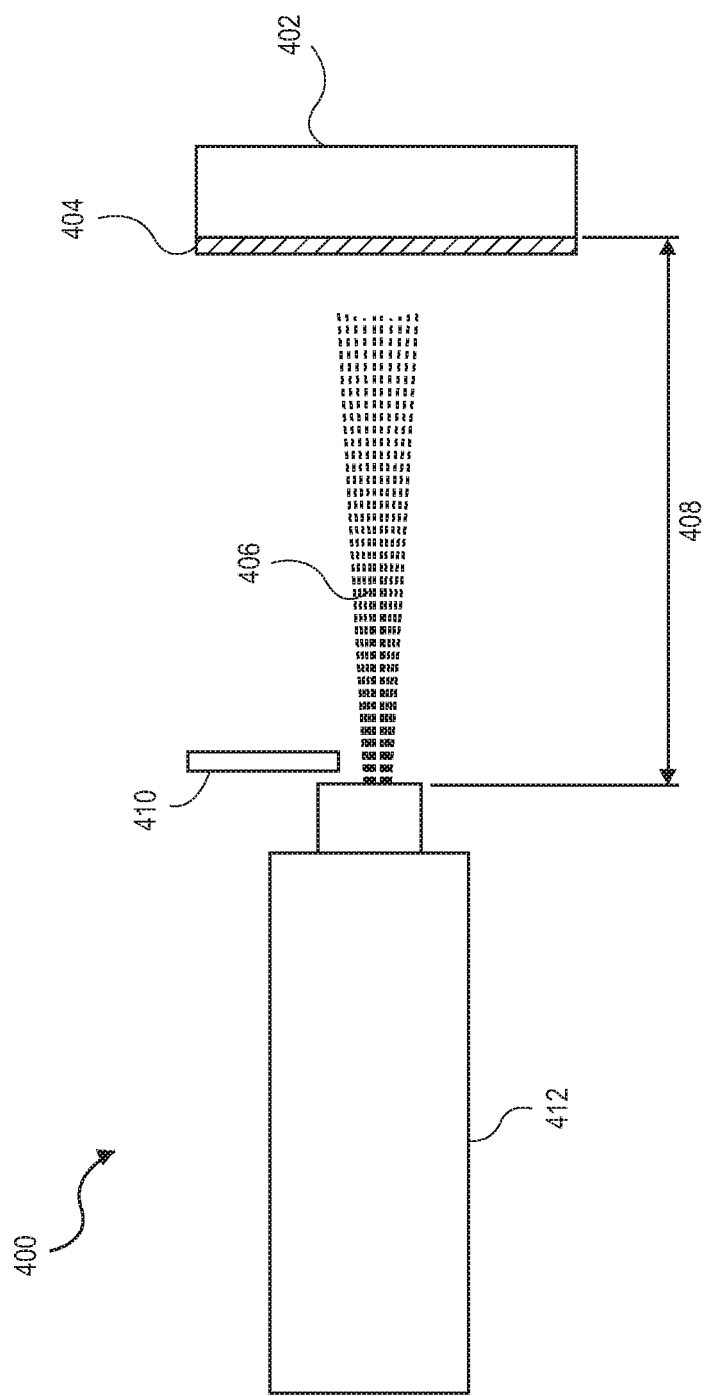
FIG. 4 is an exemplary precision plasma spray system for patterning semiconductor processing tool components with devices, in accordance with embodiments of the present invention.

FIG. 4 is an exemplary precision plasma spray system 400 for patterning semiconductor processing tool components with devices, in accordance with embodiments of the present invention.

The precision plasma spray system 400 includes a stage or sample holder for supporting a component substrate 402 to be patterned in a precision plasma spray cell. A powder injector 410 introduces a powder into a plasma flame 406 generated by a plasma spray gun 412 within the precision plasma spray cell, melting the powder. The system then directs the molten powder to impact the substrate 402 in a pattern to form the sensor or other device 404. For example, the system injects fine powders into a small thermal flame, causing the molten powder to accelerate and collimate, to directly form patterns on the component substrate 402. According to an embodiment, the plasma flame 406 is located at a distance 408 from the component substrate 402 to precisely pattern the component substrate 402 without significantly increasing the temperature of the component substrate 402, therefore enabling patterning without deforming the patterned component.

Figure 5:
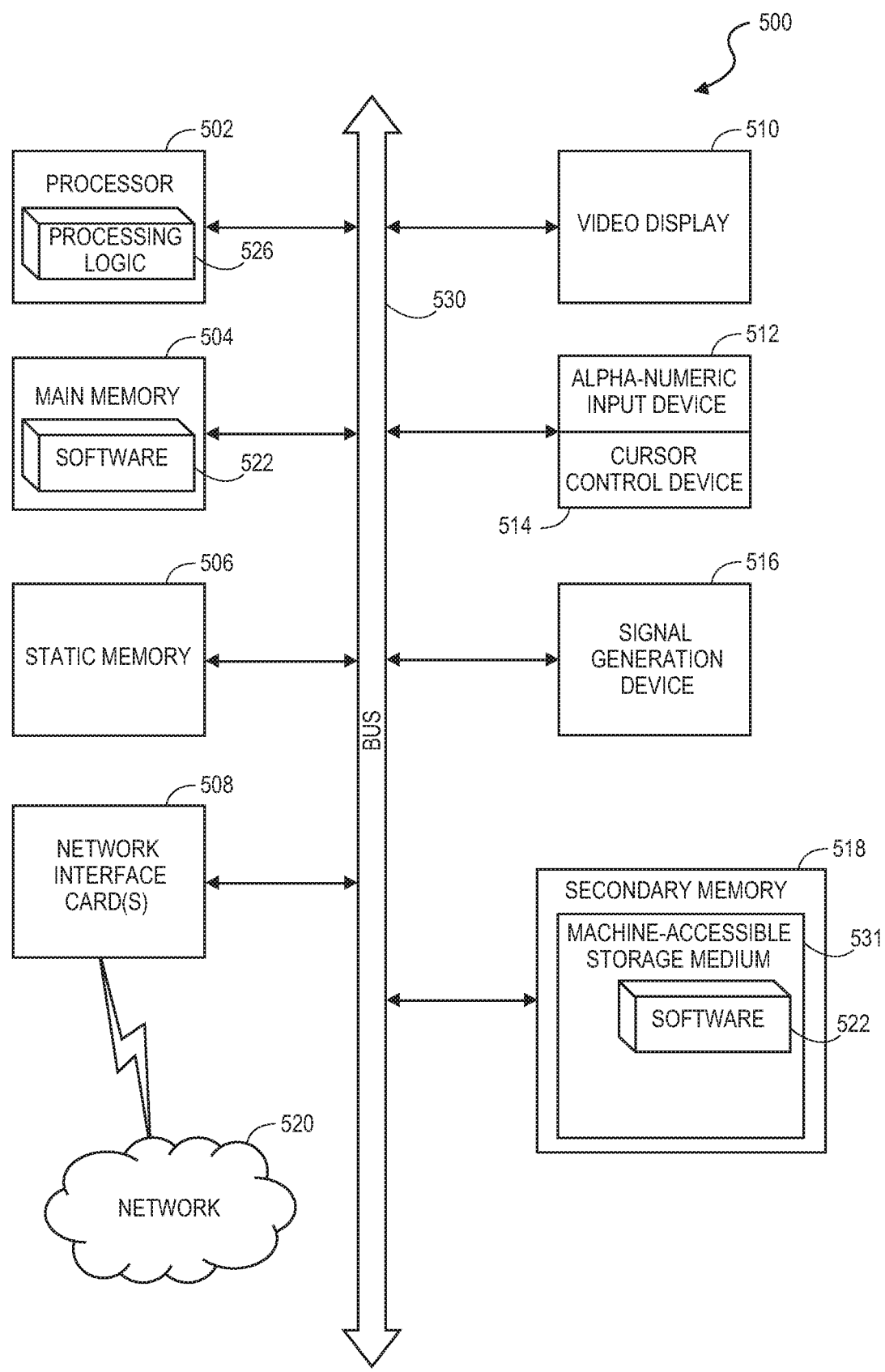
FIG. 5 illustrates a block diagram of an exemplary computer system within which a set of instructions, for causing the computer system to perform any one or more of the methodologies discussed herein, may be executed.

FIG. 5 illustrates a computer system 500 within which a set of instructions, for causing the machine to execute one or more of the scribing methods discussed herein may be executed. The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, etc. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention.

For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Thus, smart device fabrication for semiconductor processing tools via precision patterning is described. Embodiments enable patterning component substrates to form devices such as heaters, sensors, thermistors, and electrodes directly on the substrate. Embodiments therefore enable improved measurements and temperature control of the processing tool components, which can improve processing and minimize defects resulting from processing.

It is to be understood that the above description is intended to be illustrative, and not restrictive. For example, while flow diagrams in the figures show a particular order of operations performed by certain embodiments of the invention, it should be understood that such order is not require e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A semiconductor processing tool component comprising:
   a showerhead;
   a sensor disposed directly on a surface of the showerhead, wherein the sensor is a strain sensor, and wherein the surface of the showerhead is a plasma-facing surface of the showerhead;
   a top layer disposed directly on the sensor; and
   a controller coupled to the sensor, wherein the controller monitors a strain from the sensor to predict a rate of erosion of the top layer, and to predict a remaining lifetime of the showerhead based on the predicted rate of erosion of the top layer within a plasma region of a plasma chamber.

2. The semiconductor processing tool component of claim 1, wherein the top layer is a plasma-resistant layer.

3. The semiconductor processing tool component of claim 1, wherein the top layer is a dielectric layer.

4. A semiconductor processing system comprising:
   a semiconductor processing chamber comprising a component, the component comprising:
   a showerhead;
   a sensor disposed directly on a surface of the showerhead oriented towards a plasma region inside of a semiconductor processing tool, wherein the sensor is a strain sensor, and wherein the surface of the showerhead is a plasma-facing surface of the showerhead; and
   a top layer disposed directly on the sensor, wherein the strain sensor is to predict a rate of erosion of the top layer directly on the sensor;
   a controller coupled to the sensor, wherein the controller monitors a strain from the sensor to predict a rate of erosion of the top layer, and to predict a remaining lifetime of the showerhead based on the predicted rate of erosion of the top layer within the plasma region of the semiconductor process tool; and
   a heating element disposed directly on the surface of the showerhead oriented towards the plasma region inside of the semiconductor processing tool, wherein the controller controls a temperature of the component with the heating element based on measurements from the sensor.

5. The semiconductor processing system of claim 4, wherein the top layer is a plasma-resistant layer.

6. The semiconductor processing system of claim 4, wherein the top layer is a dielectric layer.

7. A semiconductor processing tool component comprising:
   a processing chamber lid;
   a sensor disposed directly on a surface of the processing chamber lid, wherein the sensor is a strain sensor, and wherein the surface of the processing chamber lid is a plasma-facing surface of the processing chamber lid; and
   a top layer disposed directly on the sensor; and
   a controller coupled to the sensor, wherein the controller monitors a strain from the sensor to predict a rate of erosion of the top layer, and to predict a remaining lifetime of the processing chamber lid based on the predicted rate of erosion of the top layer within a plasma region of a plasma chamber.

8. The semiconductor processing tool component of claim 7, wherein the top layer is a plasma-resistant layer.

9. The semiconductor processing tool component of claim 7, wherein the top layer is a dielectric layer.

10. A semiconductor processing system comprising:
    a semiconductor processing chamber comprising a component, the component comprising:
    a processing chamber lid;
    a sensor disposed directly on a surface of the processing chamber lid oriented towards a plasma region inside of a semiconductor processing tool, wherein the sensor is a strain sensor, and wherein the surface of the processing chamber lid is a plasma-facing surface of the processing chamber lid; and
    a top layer disposed directly on the sensor;
    a controller coupled to the sensor, wherein the controller monitors a strain from the sensor to predict a rate of erosion of the top layer, and to predict a remaining lifetime of the processing chamber lid based on the predicted rate of erosion of the top layer within a plasma region of the semiconductor processing tool; and
    a heating element disposed directly on the surface of the processing chamber lid oriented towards the plasma region inside of the semiconductor processing tool, wherein the controller controls a temperature of the component with the heating element based on measurements from the sensor.

11. The semiconductor processing system of claim 10, wherein the top layer is a plasma-resistant layer.

12. The semiconductor processing system of claim 10, wherein the top layer is a dielectric layer.

* * * * *